United States Patent [19]
Ang et al.

[11] Patent Number: 5,199,002
[45] Date of Patent: Mar. 30, 1993

[54] SRAM-ADDRESS-CHANGE-DETECTION CIRCUIT

[75] Inventors: Michael A. G. Ang, Santa Clara; Kevin W. Glass, Sunnyvale; David J. Pilling, Los Altos Hills, all of Calif.

[73] Assignee: Integrated Device Technology, Inc., Santa Clara, Calif.

[21] Appl. No.: 591,439

[22] Filed: Oct. 1, 1990

[51] Int. Cl.[5] .............................................. G11C 7/00
[52] U.S. Cl. .................................... 365/233.5; 365/203; 307/265; 328/111
[58] Field of Search ................... 365/233.5, 233, 226, 365/230.06, 203; 307/449, 265, 480; 328/111

[56] References Cited

U.S. PATENT DOCUMENTS 4,710,904 12/1987 Suzuki ................................. 365/226
4,922,122 5/1990 Dubujet ............................. 365/233.5
4,965,474 10/1990 Childers et al. .................. 365/233.5

Primary Examiner—Joseph A. Popek
Attorney, Agent, or Firm—Thomas E. Schatzel

[57] ABSTRACT

For enabling a static, random-access-memory (500) bit lines (556 and 558) pre-charging circuit (518), employed is an address-change-detection circuit (510) having a plurality of address-change-detectors (570 and 572) each for detecting a change in an associated SRAM addressing signal and, driven by the address-change detectors (570 and 572), a pulse generator (700) driving the pre-charging circuit (518).

9 Claims, 3 Drawing Sheets

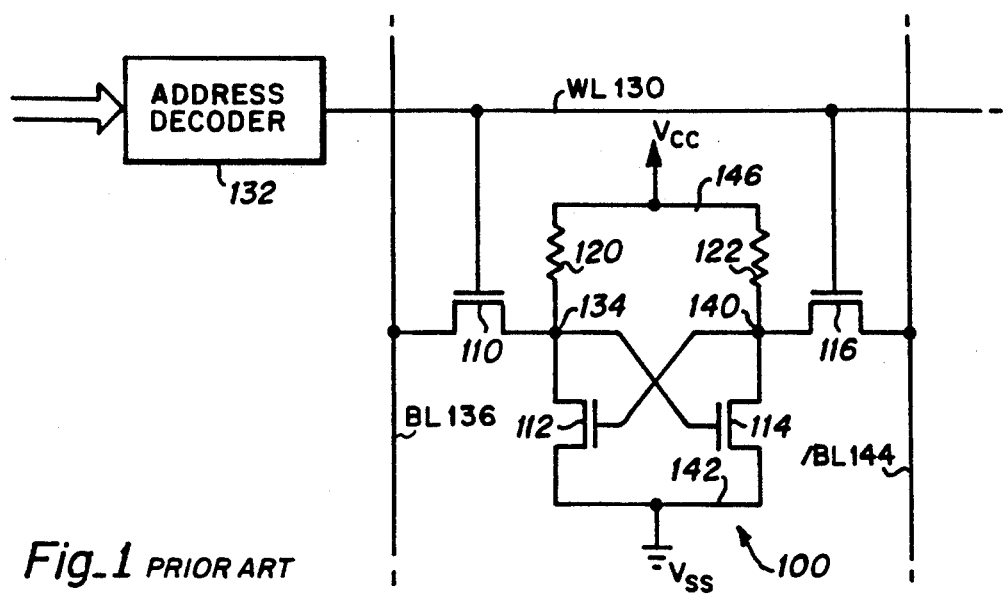
*Fig_1* PRIOR ART
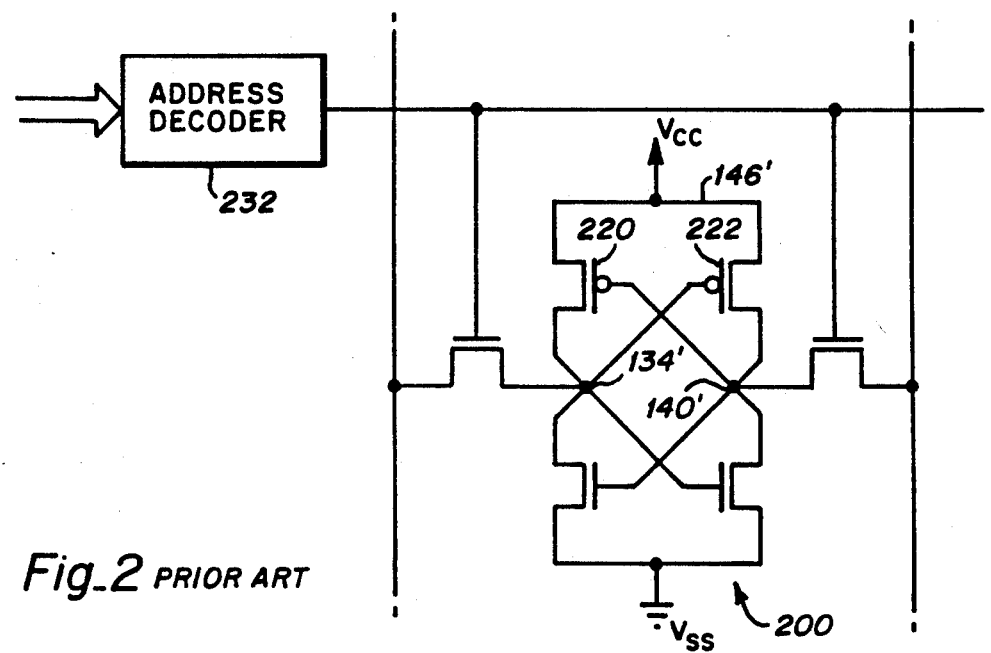
*Fig_2* PRIOR ART
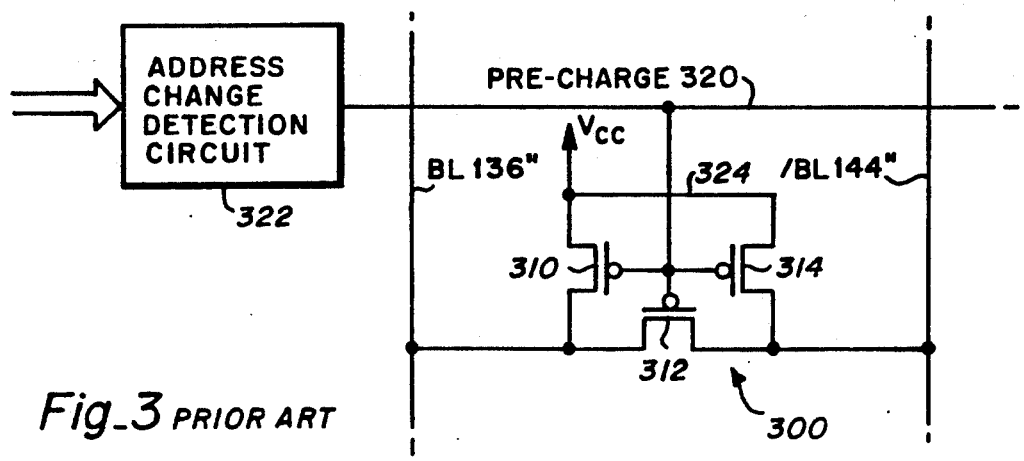
*Fig_3* PRIOR ART

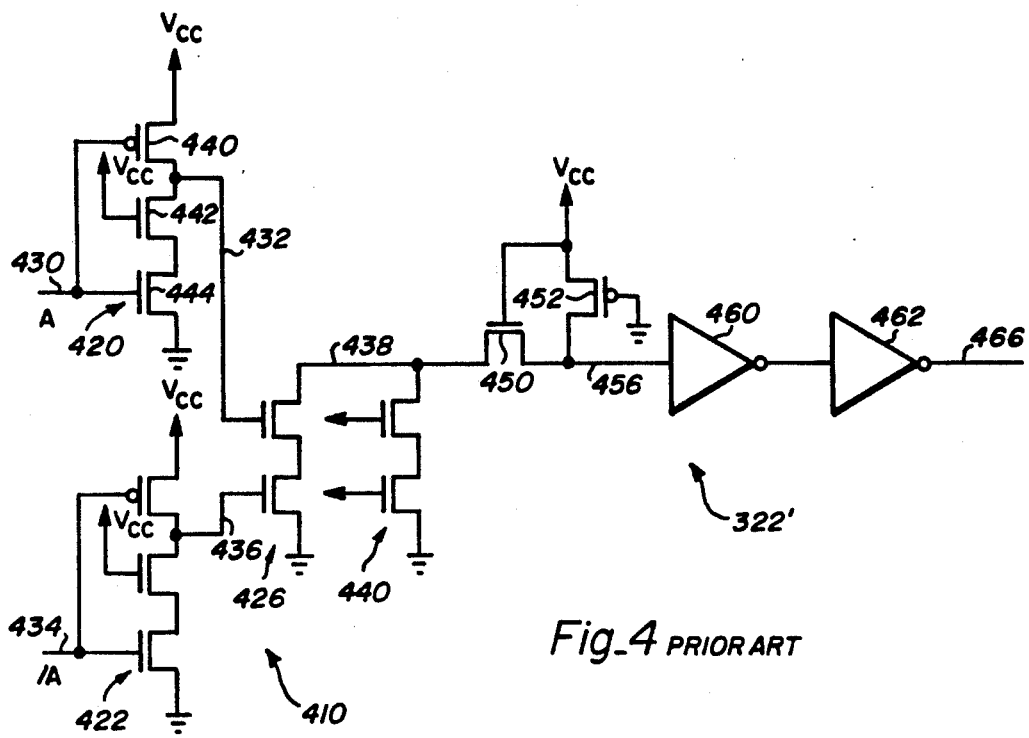
Fig_4 PRIOR ART
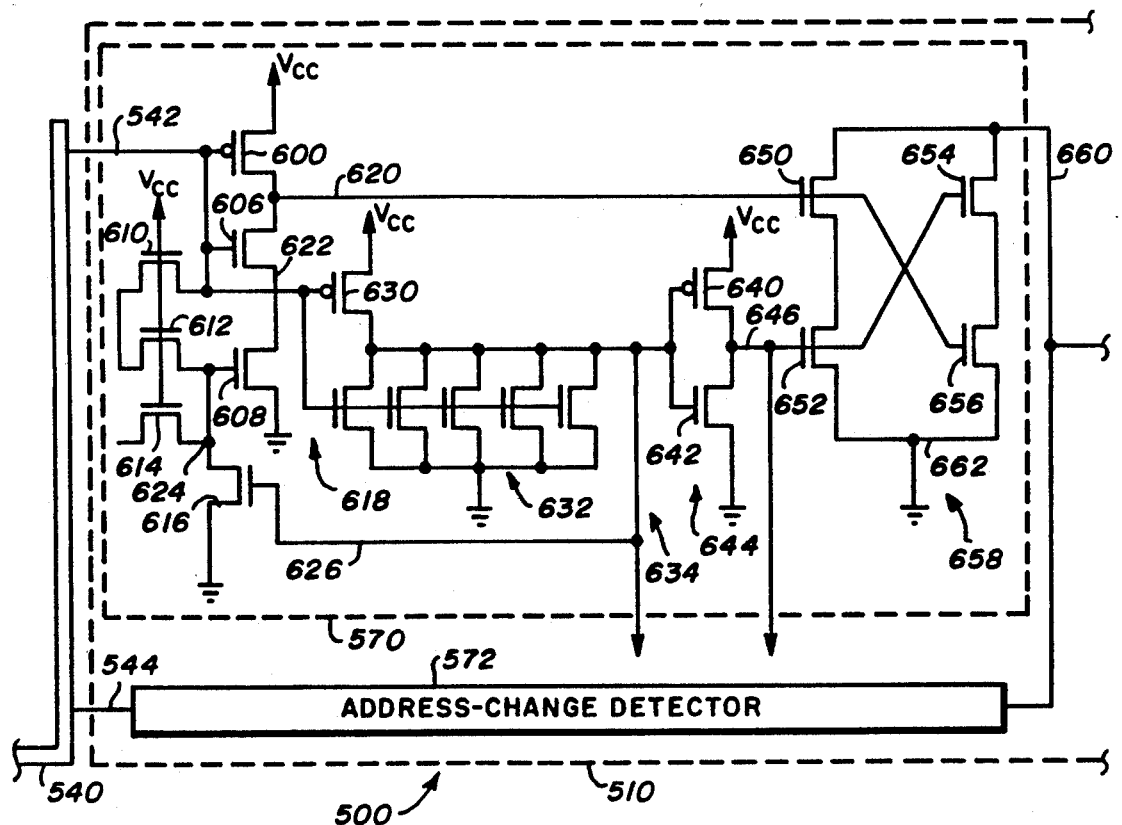
Fig_5A

SRAM-ADDRESS-CHANGE-DETECTION CIRCUIT

TECHNICAL FIELD

The present invention relates to integrated circuits generally and more particularly to a static, random-access-memory address-change-detection circuit.

BACKGROUND ART

Static, random-access memories (SRAMs) employ a number of cells, each for storing a single binary bit of information. Typical, prior art type, SRAM cell structures include what is commonly referred to as a four-transistor, two-resistor (4T-2R) SRAM cell and what is commonly referred to as a six-transistor (6T) SRAM cell. A prior art type (4T-2R) SRAM cell is illustrated in (prior art) FIG. 1 of the drawing, generally designated by the number 100. SRAM cell 100 is shown to include four, N-channel, transistors, which are respectively designated 110, 112, 114, and 116, and two (load) resistors, which are respectively designated 120 and 122 and which have a relatively high resistance. Transistor 110 is configured as a transfer transistor with the transistor gate connected to an (active high) word (control) line (WL), which is designated 130 and which is driven by an address decoder 132. The channel of transistor 110 is connected between a node 134 and an (active high) bit (input/output) line (BL) 136. Transistor 112 is configured as a pull-down transistor with the transistor gate connected to a node 140 and with the transistor channel connected between node 134 and a line 142, which is connected to a circuit ground potential (Vss). Also, configured as a pull-down transistor, the gate of transistor 114 is connected to node 134; and, the channel of the transistor is connected between node 140 and circuit ground potential line 142. Transistor 116 is, also, configured as a transfer transistor with the transistor gate connected to word (control) line (WL) 130 and with the transistor channel connected between node 140 and an (active low) bit (input/output) line (/BL) 144. Finally, resistors 120 and 122 are configured as a pull-up resistors, resistor 120 being connected between node 134 and a line 146, which is connected to a power-supply potential (Vcc), and resistor 122 being connected between node 140 and power-supply-potential line 146.

Illustrated in (prior art) FIG. 2, generally designated by the number 200, is a prior art type, six transistor (6T) SRAM cell. The six transistor (6T) SRAM cell (200) differs from the four transistor, two resistor (4T-2R) SRAM cell (100) (illustrated in FIG. 1) in that the (6T) SRAM cell (200) includes two, P-channel, (load) transistors, respectively designated 220 and 222, in place of the resistors (120 and 122) of the (4T-2R) SRAM cell (100). The transistor replacing resistor 120 is configured with the transistor gate connected to a node 140' and with the transistor channel connected between a power-supply-potential line 146' and a node 134'. Similarly, the transistor replacing resistor 122 is configured with the transistor gate connected to node 134' and with the transistor channel connected between power-supply-potential line 146' and node 140'.

Operationally, when a binary bit of information is being stored in SRAM cell 100 (illustrated in FIG. 1 or SRAM cell 200 illustrated in FIG. 2), address decoder 132 develops a high-logic-level potential on (active high) word (control) line (WL) 130 to select the cell. In addition, a strong, complementary, signal is externally developed on (active high) bit (input/output) line (BL) 136 and (active low) bit (input/output) line (/BL) 144, as is appropriate to represent the state of the binary bit of information being stored in SRAM cell 100 (or SRAM cell 200).

When a binary bit of information is being retrieved from SRAM cell 100 (illustrated in FIG. 1 or SRAM cell 200 illustrated in FIG. 2), address decoder 132, again, develops a high-logic-level potential on (active high) word (control) line (WL) 130 to select the cell. In this case, however, no potential is externally forced on either (active high) bit (input/output) line (BL) 136 or (active low) bit (input/output) line (/BL) 144. Rather, SRAM cell 100 (or SRAM cell 200) is allowed to develop on (active high) bit (input/output) line (BL) 136 and (active low) bit (input/output) line (/BL) 144 potentials, the levels of which are appropriate to represent the state of the binary bit of information currently stored in SRAM cell 100 (or SRAM cell 200).

Common practice is to employ resistors (120 and 122) of relatively high resistance for the load resistors of the four-transistor, two-resistor (4T-2R) SRAM cell (shown in FIG. 1) and to employ transistors (220 and 222) of relatively small size for the load transistors of the the six transistor (6T) SRAM cell (shown in FIG. 2). As a consequence, they (the load resistors and transistors) are not able to effectively pull-up the level of potentials developed on the bit lines. To pull-up the level of the potentials developed on the bit lines (for fast write recovery) and to prevent a low bit line potential level from disturbing the state of the binary bit of information stored in a cell, common practice is to pull-up the level of the potentials on the bit lines externally, statically pre-charging the lines. For this purpose, common practice is to employ a pair of bit-line pull-up resistors, each connected between a power-supply potential (Vcc) and the respective one of the bit lines. Also, to equalize the level of the potentials developed on the bit lines and to limit their swing, common practice is to employ a transistor configured with the transistor channel connected between the bit lines. Unfortunately, contention occurs between the active one of the SRAM cell pull-down transistors (112 or 114) and the corresponding bit-line pull-up resistor. In addition, the limited, differential, bit line potentials (of a few hundred millivolts) must be amplified (to CMOS) potential levels. For this purpose, a sense amplifier which has a relatively high gain and dissipates a relatively large amount of power is employed.

Other prior-art implementations employ pre-charge circuits of the type which is illustrated in (prior art) FIG. 3, generally designated by the number 300. Pre-charge circuit 300 is shown to include three, P-channel, transistors, which are respectively designated 310, 312, and 314. Transistor 310 is configured with the transistor gate connected to an (active low) pre-charge (control) line, which is designated 320 and which is driven by an address change detection circuit 322. The channel of transistor 310 is connected between an (active high) bit (input/output) line (BL) 136" and a line 324, which is connected to a power-supply potential (Vcc). Transistor 312 is configured with the transistor gate connected to pre-charge line 320 and with the transistor channel connected between bit line (BL) 136" and an (active low) bit (input/output) line (/BL) 144". Transistor 314 is configured with the transistor gate connected to pre-charge line 320 and with the transistor channel connected between bit line (/BL) 144" and power-supply-potential line 324.

Operationally, when a low-logic-level potential is momentarily developed on (active low) pre-charge (control) line 320, (just before a binary bit of information is to be retrieved from a SRAM cell) transistors 310 and 314 pull-up the level of the potentials developed on (active high) bit (input/output) line (BL) 136" and (active low) bit (input/output) line (/BL) 144". Transistor 312 pulls-up the lower level potential, equalizing the level of the potentials developed on bit lines 136" and 144", to develop a uniform (matching) high-potential level thereon.

A prior art type address-change-detection circuit is shown in FIG. 9 of the article by Donoghue et al entitled "ROM Using A Four-State Cell Approach" published on page 601 of the IEEE Journal Of Solid State Circuits Vol. SC-20 No. 2. The above mentioned, address-change-detection circuit, which is illustrated, herein, in (prior art) FIG. 4, generally designated by the number 322', employs a number of, similar, address-change-detectors, one for each (binary) address signals. One such address-change-detector is illustrated, herein, in FIG. 4, generally designated by the number 410. Address-change-detector 410 is shown to have a pair of, similar, waveform conditioners, generally designated designated 420 and 422, respectively, and a two-input NAND gate, generally designated 426. Waveform conditioner 420 has an input connected to a line 430 to receive the (binary) address signal and an output coupled by a line 432 to one of the two inputs on NAND gate 426. Waveform conditioner 422 has an input connected to a line 434 to receive the compliment (inverse) of the (binary) address signal developed on line 430 and an output coupled by a line 436 to the other one of the two inputs on NAND gate 426. The output of NAND gate 426 is connected to a "common bus" line 438.

Typical of the waveform conditioners, waveform conditioner 420 includes a P-channel transistor, designated 440, and a pair of N-channel transistors, respectively designated 442 and 444. Transistors 440, 442, and 444 are connected in a totem-pole configuration in which the channel of transistor 440 is connected, one end to receive a power-supply potential (Vcc) and the other end to the channel of transistor 442; the channel of transistor 442 is connected between the channel of transistor 440 and the channel of transistor 444; and the channel of transistor 444 is connected, one end to the channel of transistor 442 and the other end to receive a circuit-ground potential (Vss). The gate of transistor 442 is connected to receive a power-supply potential (Vcc). The gates of transistors 440 and 444 are connected to the waveform conditioner (420) input (line 430); and, the waveform conditioner (420) output (line 432) is connected to the juncture of the channels of transistors 440 and 442.

It is indicated in the article that the width of the channel of the middle transistor (442) is much smaller than the length of the channel of the transistor. As a consequence, the middle transistor (442) functions as a resistor, limiting the rate at which the lower transistor (444) can pull-down the level of a potential developed at the waveform conditioner (420) output. Thus, each of the waveform conditioners (including waveform conditioner 420) functions as an inverter having a relatively fast rise time and a relatively slow fall time. In other words, waveform conditioner 420 develops at waveform conditioner output (line 432) a waveform having a relatively fast rise time and a relatively slow fall time. Responsive to the change in state of a pair of (binary) address signals (such as those developed on lines 430 and 434), one of the respective pair of waveform conditioners (420 or 422) changes the state (pulls-down) the level of the potential developed at the waveform conditioner output a period of time after the other one of the pair of waveform conditioners (420 or 422) changes the state (pulls-up) the level of the potential developed at the waveform conditioner output. Responsive thereto, the corresponding NAND gate (438) develops on "common bus" line 438 a potential, the level of which goes low for a period of time. (In other words, each of the waveform conditioners functions much as an exclusive-NOR gate driven, one input directly by a signal and the other input by the signal delayed, as by a pair of cascade connected inverters.)

Although not show in either the above mentioned article or herein, for proper operation, it is believed that address-change-detection circuit 322' requires a number of TTL-to-CMOS level converters, one between each waveform conditioner input and the corresponding (binary) address line.

The various address-change-detectors (of the above-mentioned address-change-detection circuit 322') are connected in a "wired-AND" configuration. Specifically, the output of NAND gate 426 (of address-change detector 410) is connected to "common bus" line 438, as is the output of each of the other NAND gates (each of the respective one of the other address-change-detection circuit 322' address-change detectors), as represented by a NAND gate 440.

In addition, address-change-detection circuit 322' employs a pull-up circuit that includes an N-channel transistor 450 and a P-channel transistor 452. To pull-up the level of the potential developed on a line 456, transistor 452 is configured with the transistor gate connected to receive a circuit ground potential (Vss) and with the transistor channel connected, one end to receive a power-supply potential (Vcc) and the other end to line 456. Transistor 450 is configured with the transistor gate connected to receive a power-supply potential (Vcc) and with the transistor channel connected between lines 438 and 456, to limit the level of the potential developed on line 438 to a potential level of Vcc minus the Vt of the transistor.

Finally, address-change-detection circuit 322' employs a pair of inverters, 460 and 462, respectively. Inverters 460 and 462 are connected in cascade (series) between line 456 and an output line 466, upon which address-change-detection circuit 322' develops an (active low) pre-charge (control) line pulse.

It is important to note that the above-mentioned, address-change-detection circuit (322') is an "open-loop" circuit. As a consequence, it is very difficult to establish the width of the pre-charge pulse developed by address-change-detection circuit 322' on line 466. Specifically, the width of the line 466 pre-charge pulse is established by various combinations of the fall times of the various waveform conditioners. The fall times of the various waveform conditioners (including waveform conditioner 420) is established by the middle transistor (transistor 442 for waveform conditioner 420), the characteristics of which are process, temperature, and power-supply potential (Vcc) dependent.

In addition, the width of the line 466 pre-charge pulse is dependent on the number of (binary) address signals (including the signal developed on line 430) which change state. This is because transistors 450 and 452 source a predetermined current level into line 438. Each of the NAND gates (including NAND gates 426 and 440) sink a predetermined current level from line 438. Thus, the fall time of the potential developed on line 438 is dependent on the number of (binary) address signals which change state.

Further, the width of the line 466 pre-charge pulse is dependent on the skew of the timing of the various (binary) address signals.

Unfortunately, static, random-access memories (SRAMs) employing the above mentioned address-change-detection circuit (322') must allow for the worst case width of the line 466 pre-charge pulse. As a consequence, static, random-access memories (SRAMs) employing the above mentioned address-change-detection circuit (322') are relatively slow (have a relatively long access time).

DISCLOSURE OF THE INVENTION

It is therefore the primary object of the present invention to provide static, random-access memories (SRAMs) which are relatively fast.

Another object of the present invention is to provide an address-change-detection circuit which develops a pre-charge pulse of relatively narrow, and well controlled, width relatively soon after a (binary) address change occurs.

Yet another object of the present invention is to provide an address-change-detection circuit which develops a pre-charge pulse the width of which holds true over a spectrum of process, device, temperature, and power supply variations and number of address line signals that change state.

Yet another object of the present invention is to provide static, random-access memories (SRAMs) which permits the use of sense amplifiers that dissipate relatively little static power.

Briefly, the presently preferred embodiment of a static, random-access memory (SRAM) 500 in accordance with the present invention, for enabling a bit lines (556 and 558) pre-charging circuit (518), employs an address-change-detection circuit (510) having a plurality of address-change detectors (570 and 572) each for detecting a change in an associated SRAM addressing signal and, driven by the address-change detectors (570 and 572), a pulse generator (700) driving the pre-charging circuit (518).

These and other objects of the present invention will no doubt become apparent to those skilled in the art after having read the detailed description of the presently preferred embodiment of the present invention which is illustrated in the figures of the drawing.

BRIEF DESCRIPTION OF THE FIGURES IN THE DRAWING

FIG. 1 is a schematic diagram of a prior-art-type four-transistor, two-resistor (4T-2R) static, random-access memory (SRAM) cell;

FIG. 2 is a schematic diagram of a prior-art-type six transistor (6T) static, random-access memory (SRAM) cell;

FIG. 3 is a schematic diagram of a prior-art-type static, random-access memory (SRAM) pre-charge circuit;

FIG. 4 is a schematic diagram of a prior-art-type static, random-access memory (SRAM) address-change-detection circuit; and FIG. 5A–5B is a schematic diagram of a portion of the presently preferred embodiment of a static, random-access memory (SRAM) in accordance with the present invention.

BEST MODE FOR CARRYING OUT THE INVENTION

Figure 5B:
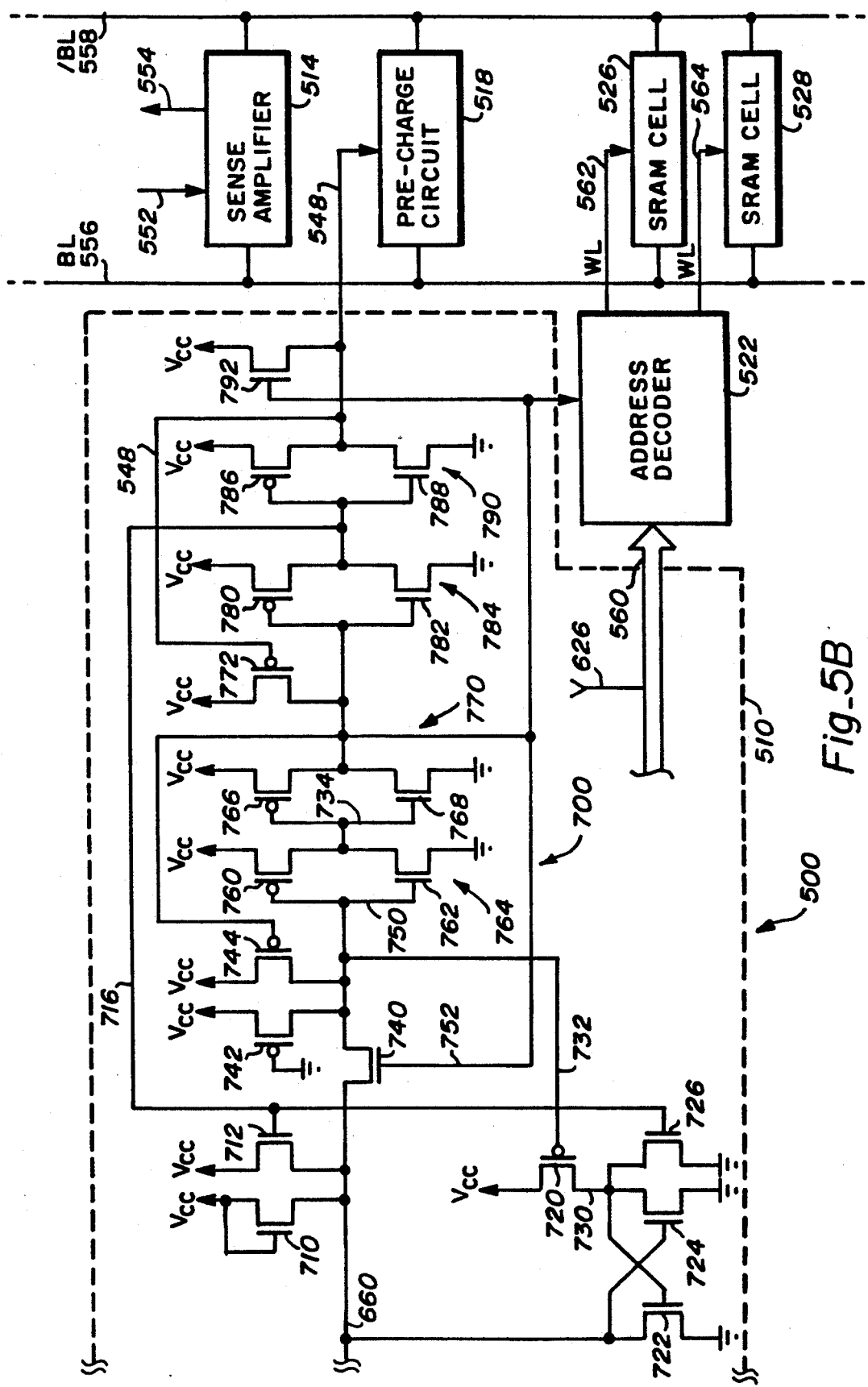

Illustrated in FIGS. 5A–5B of the drawing generally designated by the number 500 is a portion of the presently preferred embodiment of a static, random-access memory (SRAM) in accordance with the present invention. SRAM 500 is shown to employ an address-change-detection circuit 510, a sense amplifier 514 (shown in FIG. 5B), a pre-charge circuit 518 (shown in FIG. 5B), an address decoder 522 (also shown in FIG. 5B), and a number of similar, static, random-access-memory (SRAM) cells, which are represented in FIG. 5B by a pair of cells that are respectively designated 526 and 528.

Address-change-detection circuit 510, has a number of inputs, one for each of the SRAM 500 (binary) address signal lines, which are collectively represented in FIG. 5A by a bus 540. Of the address-change-detection circuit 510 (binary) address signal inputs, one is shown connected to a bus 540 line 542; and, another one is shown connected to a bus 540 line 544. In the presently preferred embodiment, each of the address signal lines of bus 540 (including lines 542 and 544) is connected directly (without a TTL-to-CMOS-level converter) to a corresponding SRAM 500 pad (to receive a TTL level, binary, address signal). In addition, address-change-detection circuit 510, has an output (shown in FIG. 5B) which is connected to an (active low) pre-charge (control) line 548.

Sense amplifier 514 has a sense amplifier enable input connected to a line 552 and a sense amplifier output connected to a line 554. In addition, sense amplifier 514 has a pair of signal inputs connected, one to an (active high) bit (input/output) line (BL) 556 and one to an (active low) bit (input/output) line (/BL) 558.

Pre-charge circuit 518 has a control input connected to (active low) pre-charge (control) line 548 and a pair of outputs connected, one to (active high) bit (input/output) line (BL) 556 and one to (active low) bit (input/output) line (/BL) 558. In the presently preferred embodiment, pre-charge circuit 518 is of the type which is illustrated, herein, in FIG. 3.

Address decoder 522 has a number of inputs, one for each of the SRAM 500 (binary) address signal bus 540 lines, which are collectively represented in FIG. 5B by a bus 560. Each of the lines of bus 560 is connected to address-change-detection circuit 510 to receive a respective, CMOS-level, binary, address signal, as will become apparent shortly. In addition, address decoder 522 has a number of outputs, including an output connected to an (active high) word (control) line (WL) 562 and an output connected to an (active high) word (control) line (WL) 564.

The static, random-access-memory (SRAM) cells, which are represented by cells 526 and 528, each have a pair of input/outputs connected, each to the respective one of the bit lines, including (active high) bit (input/output) line (BL) 556 and (active low) bit (input/output) line (/BL) 558. Further, the SRAM cells each have a control input connected to a respective one of the word lines, the SRAM cell 526 control input being connected to (active high) word (control) line (WL) 562 and the SRAM cell 528 control input being connected to an (active high) word (control) line (WL) 564. In one embodiment, the SRAM cells (including SRAM cells 526 and 528) are of the four-transistor, two-resistor (4T-2R) type which is illustrated, herein, in FIG. 1. In another embodiment, the SRAM cells (including SRAM cells 526 and 528) are of the six-transistor (6T) type which is illustrated, herein, in FIG. 2. In yet another embodiment, the SRAM cells (including SRAM cells 526 and 528) are of a dual-port type which differs from the six-transistor (6T) type (illustrated in FIG. 2) in that the dual-port SRAM cells each include an additional pair of transfer transistors, each connected to selectively couple the cell to a respective one of an additional pair of bit lines.

Address-change-detection circuit 510, has a number of similar address-change detectors, one for each of the SRAM 500 (binary) address signal lines. The address-change-detection circuit 510 address-change detectors are represented in FIG. 5A by a pair of address-change detectors, that are respectively designated 570 and 572. Typical of the address-change-detection circuit 510 address-change detectors, address-change detector 570 includes a P-channel transistor 600 and six, N-channel, transistors, which are respectively designated 606, 608, 610, 612, 614, and 616. (Collectively, transistors 600, 606, 608, 610, and 612 are referred to by the number 618.) Transistors 600, 606, and 608 are connected in a totem-pole configuration in which the channel of transistor 600 is connected, one end to receive a power-supply potential (Vcc) and the other end to a line 620; the channel of transistor 608 is connected between line 620 and a line 622; and the channel of transistor 608 is connected, one end to line 622 and the other end to receive a circuit-ground potential (Vss). The gates of transistors 600 and 606 are connected to line 542; and, the gate of transistor 608 is connected to a line 624. The channels of transistors 610 and 612 are connected in series between lines 542 and 624; and, one end of the channel of transistor 614 is, also, connected to line 624. The gates of transistors 610, 612, and 614 are connected to receive a power-supply potential (Vcc). Transistor 616 is configured with the transistor channel connected, one end to line 624 and the other end to receive a circuit-ground potential (Vss), and with the transistor gate connected to a line 626, which forms one of the lines of bus 560 (shown in FIG. 5B).

In addition, address-change detector 570 includes a P-channel transistor 630 and five, N-channel, transistors, which are collectively designated 632 and which, with transistor 630, are collectively designated 634. Transistor 630 and the transistors, which are collectively designated 632, are connected in a P-channel-over-N-channel inverter configuration between lines 542 and 626. More specifically, transistor 630 is configured with the transistor gate connected to line 542 and with the transistor channel connected, one end to receive a power-supply potential (Vcc) and the other end to line 626. The transistors which are collectively designated 632 are each configured with the transistor gate connected to line 542 and with the transistor channel connected, one end to line 626 and the other end to receive a circuit-ground potential (Vss).

Also, address-change detector 570 includes a P-channel transistor 640 and an N-channel transistor 642, the combination designated 644. Transistors 640 and 642 are connected in the P-channel-over-N-channel inverter configuration between line 626 and a line 646. More specifically, transistor 640 is configured with the transistor gate connected to line 626 and with the transistor channel connected, one end to receive a power-supply potential (Vcc) and the other end to line 646. Transistor 642 is configured with the transistor gate connected to line 626 and with the transistor channel connected, one end to line 646 and the other end to receive a circuit-ground potential (Vss).

Further, address-change detector 570 includes four, N-channel, transistors, which are respectively designated 650, 652, 654, and 656 and which are collectively designated 658. Transistors 650, 652, 654, and 656 are connected in a NAND gate configuration. More specifically, the channels of transistors 650 and 652 are connected in series between a "common-bus" line 660 and a line 662, which is connected to receive a circuit-ground potential (Vss). Similarly, the channels of transistors 654 and 656 are connected in series between "common-bus" line 660 and circuit-ground potential line 662. The gates of transistors 650 and 656 are connected to line 620; and, the gates of transistors 652 and 654 are connected to line 646.

The transistors 650, 652, 654, and 656 of NAND gate 658 are connected to "common-bus" line 660 in a "wired-AND" configuration with the other NAND gates, including the NAND gate of address-change detector 572.

In the presently preferred embodiment, the transistors of address-change detector 570 have the following parameters:

| TRANSISTOR(S) | TYPE | CHANNEL WIDTH | CHANNEL LENGTH |
|---|---|---|---|
| 600 | P-channel | 12.0 Microns | 1.0 Microns, |
| 606 | N-Channel | 49.0 Microns | 1.0 Microns, |
| 608 | N-Channel | 54.0 Microns | 1.0 Microns, |
| 610 | N-Channel | 3.0 Microns | 3.0 Microns, |
| 612 | N-Channel | 3.0 Microns | 3.0 Microns, |
| 614 | N-Channel | 3.0 Microns | 3.0 Microns, |
| 616 | N-Channel | 2.4 Microns | 2.0 Microns, |
| 630 | N-Channel | 30.0 Microns | 1.8 Microns, |
| 632 | N-Channel | 30.0 Microns each | 2.0 Microns each, |
| 640 | P-Channel | 18.0 Microns | 1.0 Microns, |
| 642 | N-Channel | 6.0 Microns | 1.0 Microns, |
| 650 | N-Channel | 15.0 Microns | 1.0 Microns, |
| 652 | N-Channel | 15.0 Microns | 1.0 Microns, |
| 654 | N-Channel | 15.0 Microns | 1.0 Microns, and |
| 656 | N-Channel | 15.0 Microns | 1.0 Microns. |

Operationally, transistors 600, 606, 608, 610, and 612, which are collectively designated 618, function as an inverter, as a TTL-to-CMOS-level converter, and as a waveform conditioner, all in one. As a waveform conditioner (618), the transistors develop on line 620 a waveform having a relatively fast rise time and a relatively slow fall time. Transistor 630 in combination with the transistors collectively designated 632, also, function as an inverter, as a TTL-to-CMOS-level converter, and as a waveform conditioner, all in one. As a waveform conditioner (634), the transistors (with the transistors 640 and 642 of inverter 644), develop on line 646 a waveform, also, having a relatively fast rise time and a relatively slow fall time. Transistors 650, 652, 654, and 656, which are collectively designated 658, function as a NAND gate. Thus, responsive to the high-to-low transition in the state of the (binary) address signal developed on line 542, waveform conditioner 634 and inverter 644 pull-down the level of the potential developed on line 646 a period of time after waveform conditioner 618 pulls-up the level of the potential developed on line 620. Responsive thereto, NAND gate 658 develops on "common bus" line 660 a potential, the level of which goes low for a period of time. Conversely, responsive to the low-to-high transition in the state of the (binary) address signal developed on line 542, waveform conditioner 618 pulls-down the level of the potential developed on line 620 a period of time after waveform conditioner 634 and inverter 644 pull-up the level of the potential developed on line 646. Responsive thereto, NAND gate 658, again, develops on "common bus" line 660 a potential, the level of which goes low for a period of time.

To develop (on line 646 a waveform having a relatively fast rise time and a relatively slow fall time to develop) on line 626 a waveform having a relatively slow rise time and a relatively fast fall time, waveform conditioner 634 includes a P-channel transistor 630 and five, N-channel, transistors, which are collectively designated 632. This results in a relatively strong (N-channel) pull-down (with respect to the P-channel pull-up). It is important to note that the waveform conditioning function of developing on line 634 a waveform having a relatively slow rise time and a relatively fast fall time is consistent with the TTL-to-CMOS-level converting function. In the presently preferred embodiment, (inverter/TTL-to-CMOS-level converter/) waveform conditioner 634 provides a TTL threshold level of approximately 1.5 volts.

It is important to note that the waveform conditioning function of developing on line 620 a waveform having a relatively fast rise time and a relatively slow fall time is, normally, inconsistent with the TTL-to-CMOS-level converting function. As previously indicated, for a TTL threshold level of approximately 1.5 volts, normally, requires that the (N-channel) pull-down transistor be much stronger that the (P-channel) pull-up transistor, resulting in a line 620 waveform having a relatively fast rise time and a relatively slow fall time. (In the presently preferred embodiment, transistor 600 has a size that is compatible with providing the TTL-to-CMOS-level converting function.)

Waveform conditioner 618 develops a line 620 waveform having a relatively fast rise time because transistors 606 and 608 are turned off rapidly and fully. As the level of the potential developed on line 542 falls, transistor 606 is progressively turned off; while, transistor 600 is progressively turned on, raising the level of the potential developed on line 622, decreasing the Vgs of transistor 606, further accelerating the turn off of transistor 606. In addition, feedback is provided to turn off transistor 608. As the level of the potential developed on line 542 falls, inverter 634 pulls-up the level of the potential developed on line 626. As the level of the potential developed on line 626 rises to the level of the Vt of transistor 616 (approximately one volt), transistor 616 is turned on, turning off transistor 608. (Transistors 610 and 612 function as a resistor, permitting the level of the potential developed on line 624 to be pulled-down. Transistor 614 is included to provide a means by which the resistance of the transistors 610 and 612 resistance may be changed.) Thus, a line 620 waveform is developed having a relatively fast rise time, the slew rate of which is relatively independent of the slew rate of the potential developed on line 542. As a consequence, NAND gate 658 develops on "common bus" line 660 a potential, the level of which goes low for an established period of time.

Waveform conditioner 618 develops a line 620 waveform having a relatively slow fall time because transistors 606 and 608 are turned on slowly. As the level of the potential developed on line 542 starts to rise, transistor 616 is still on, holding transistor 608 off for a period of time, preventing transistors 606 and 608 from pulling-down the line 620 potential level. Also, the rate at which transistor 608 is turned on is controlled by the transistors 610 and 612 resistance and the circuit capacitance, including the gate-channel capacitance of transistor 608. Thus, a line 620 waveform is developed having a relatively slow fall time, the slew rate of which is predetermined by the (transistors 610 and 612) resistance-capacitance time constant. As a consequence, NAND gate 658 develops on "common bus" line 660 a potential, the level of which goes low for an established period of time.

Of course, transistors 650 and 652, independent of transistors 654 and 656, function as a NAND gate. However, absent transistors 654 and 656, the delay when transistor 650 is on and transistor 652 goes from off to on is different than the delay when transistor 652 is on and transistor 650 goes from off to on. The combination of transistors 650, 652, 654, and 656 minimizes and equalizes the delay.

Address-change-detection circuit 510, has a pulse generator, which is designated generally, in FIG. 5B, by the number 700. Pulse generator 700 includes a pair of N-channel transistors, which are respectively designated 710 and 712. Transistor 710 is configured as a resistor with the transistor gate connected to receive a power-supply potential (Vcc) and with the transistor channel connected, one end to receive a power-supply potential (Vcc) and the other end connected to line 660. Transistor 712 is connected in a pull-up configuration, with the transistor gate connected to a line 716 and with the transistor channel connected, one end to receive a power-supply potential (Vcc) and the other end connected to line 660.

In addition, pulse generator 700 includes a P-channel transistor 720 and three, N-channel, transistors, which are respectively designated 722, 724, and 726. Transistor 720 is connected in the pull-up configuration, with the transistor channel connected, one end to receive a power-supply potential (Vcc) and the other end connected to a line 730, and with the transistor gate connected to a line 732. Transistors 722, 724, and 726 are each connected in a pull-down configuration. The channel of transistor 722 is connected, one end to line 660 and the other end to receive a circuit-ground potential (Vss); and, the gate of the transistor is connected to line 730. The channel of transistors 724 and 726 are each connected, one end to line 660 and the other end to receive a circuit-ground potential (Vss). The gate of transistor 724 is connected to line 660; and, the gate of transistor 726 is connected to line 716.

Also, pulse generator 700 includes an N-channel transistor 740 and a pair of P-channel transistors, which are respectively designated 742 and 744. Transistor 700 is configured as a switch (transfer transistor) with the transistor channel connected between line 660 and a line 750 and with the transistor gate connected to a line 752. Transistor 742 is configured as a resistor with the transistor gate connected to receive a circuit-ground potential (Vss) and with the transistor channel connected, one end to receive a power-supply potential (Vcc) and the other end connected to line 750. Transistor 744 is connected in a pull-up configuration, with the transistor gate connected to line 752 and with the transistor channel connected, one end to receive a power-supply potential (Vcc) and the other end connected to line 750.

Further, pulse generator 700 includes a P-channel transistor 760 and an N-channel transistor 762, the combination designated 764; a P-channel transistor 766 and an N-channel transistor 768, the combination designated 770; and another P-channel transistor 772. Transistors 760 and 762 are connected in the P-channel-over-N-channel inverter configuration between lines 750 and 732. Transistors 766 and 768 are, also, connected in the P-channel-over-N-channel inverter configuration, in this case, between lines 732 and 752. Transistor 772 is connected in a pull-up configuration with the transistor gate connected to line 548 and with the transistor channel connected, one end to receive a power-supply potential (Vcc) and the other end connected to line 752.

Finally, pulse generator 700 includes a P-channel transistor 780 and an N-channel transistor 782, the combination designated 784; a P-channel transistor 786 and an N-channel transistor 788, the combination designated 790; and another N-channel transistor 792. Transistors 780 and 782 are connected in the P-channel-over-N-channel inverter configuration between lines 752 and 716. Transistors 786 and 788 are, also, connected in the P-channel-over-N-channel inverter configuration, in this case, between lines 716 and 548. Transistor 792 is connected in a pull-up configuration with the transistor gate connected to line 752 and with the transistor channel connected, one end to receive a power-supply potential (Vcc) and the other end connected to line 548.

In the presently preferred embodiment, the transistors of pulse generator 700 have the following parameters:

| TRANSISTOR | TYPE | CHANNEL WIDTH | CHANNEL LENGTH |
|---|---|---|---|
| 710 | N-channel | 2.0 Microns | 1.2 Microns, |
| 712 | N-Channel | 20.0 Microns | 1.0 Microns, |
| 720 | P-Channel | 15.0 Microns | 1.0 Microns, |
| 722 | N-Channel | 15.0 Microns | 1.0 Microns, |
| 724 | N-Channel | 2.0 Microns | 1.0 Microns, |
| 726 | N-Channel | 5.0 Microns | 1.0 Microns, |
| 740 | N-Channel | 25.0 Microns | 1.0 Microns, |
| 742 | P-Channel | 8.0 Microns | 1.6 Microns, |
| 744 | P-Channel | 25.0 Microns | 1.0 Microns, |
| 760 | P-Channel | 50.0 Microns | 1.0 Microns, |
| 762 | N-Channel | 19.0 Microns | 1.0 Microns, |
| 766 | P-Channel | 60.0 Microns | 1.0 Microns, |
| 768 | N-Channel | 180.0 Microns | 1.0 Microns, |
| 772 | P-Channel | 8.0 Microns | 1.8 Microns, |
| 780 | P-Channel | 60.0 Microns | 1.0 Microns, |
| 782 | N-Channel | 30.0 Microns | 1.0 Microns, |
| 786 | P-Channel | 100.0 Microns | 1.0 Microns, |
| 788 | N-Channel | 140.0 Microns | 1.0 Microns, and |
| 792 | N-Channel | 20.0 Microns | 1.0 Microns. |

Operationally, following power-on, pulse generator 700 assumes a steady-state condition in which transistor 740 is on and high-logic-level potentials are developed on lines 660, 732, 752, and 548. For purposes of discussion, assume that, following power-on, transistor 740 is off. Then, transistor 742 would pull up the level of the potential developed on line 750 to a high-logic-level potential. The high-logic-level potential developed on line 750 would turn off transistor 720. Also, the high-logic-level potential developed on line 750 would cause inverters 764 and 770 to develop a high-logic-level potential on line 752, causing inverters 784 and 790 to develop a high-logic-level potential on line 548. The high-logic-level potential developed on line 752 would turn on transistor 740. Transistor 740, alone, would be able to pull-up the level of the potential developed on line 660 to a steady state potential level of Vcc-Vt. A low-logic-level potential momentarily developed on line 752 would cause inverter 784 to, momentarily, develop a high-logic-level potential on line 716, turning on transistor 726, which turns off transistor 722. Transistors 722 and 724, being cross coupled, exhibit regenerative properties, which make the continued drive of transistor 726 unnecessary. That being so, the high-logic-level potential maintained on line 752 at steady state causes inverter 784 to maintain a low-logic-level potential on line 716 during steady state, turning off transistor 726. Because transistor 722 is off, transistors 710 and 740 (both of which are on at this time) allow the potential developed on line 660 to remain at the steady state potential level of Vcc-Vt without antagonism.

When the level of the potential developed on "common bus" line 660 is pulled down (by one of the address-change-detection circuit 510 address-change detectors, such as, for example, address-change detector 570, shown in FIG. 5A), the level of the potential developed on line 750 will, also, be pulled down. At this point, transistors 712, 744, and 772 remain in their steady state (off); and, transistors 710 and 742 will act as load resistors. In regenerative fashion, transistor 724 will be turned off; and, transistor 720 will be turned on, turning on transistor 722, which, further, pulls down the level of the potential developed on lines 660 and 732.

A predetermined period of time (established by the delay of inverters 764 and 770) after the level of the potential developed on line 750 is pulled down, the inverters (764 and 770) will develop a low-logic-level potential on line 752. The low-logic-level potential developed on line 752 will turn off transistor 740 and will turn on transistor 744. With transistor 740 turned off and transistor 744 turned on, transistor 744 will pull back up the level of the potential developed on line 732. (In the presently preferred embodiment, the line 752 signal is, also, used as a word line inhibit signal to drive address decoder 522.)

Responsive to the low-logic level potential developed on line 752, inverter 784 is operative to develop a high-logic-level potential on line 716, turning on transistors 712 and 726. Transistor 726 turns off transistor 722; and, transistor 712 pulls up the level of the potential developed on line 660 (overriding the NAND gates, including NAND gate 658, shown in FIG. 5A, if they are still on, a condition indicative of excess skew between address input line signals).

A predetermined period of time (established by the delay of inverters 784 and 790) after the level of the potential developed on line 752 is pulled down, the inverters (784 and 790) will develop a low-logic-level potential on line 548. The low-logic-level potential developed on line 548 will turn on transistor 772, pulling back up the level of the potential developed on line 752, which is coincident with the pull-up action of transistor 766, avoiding current contention with transistor 768.

It is important to note that pulse generator 700 functions as a closed-loop system in which well controlled state transitions set the timing. As a consequence, the width of the pre-charge-enable line 548 pulse is accurately defined. As a further consequence, there can not be a missing pulse, guaranteeing that bit lines 556 and 558 are pre-charged. Further, the pre-charge-enable line 548 pulse has relatively fast rise and fall times. The regenerative action of transistors 720, 722, 724, and 726 accelerates the pull-down of line 660 defining the start of the pulse; and, the regenerative action of transistors 744, 772, and 792 accelerate the pull-up defining the end of the pulse. Transistors 740 and 710 insure that oscillation or other instability can not occur. (In one embodiment, transistor 710, which is redundant, is not included.) Finally, it is important to note that the potential developed on line 752 acts as a word line inhibitor, guaranteeing that no SRAM cell is connected to the respective bit lines during the pre-charging process, insuring the proper pre-charge potential levels on the bit lines.

In the presently preferred embodiment, the various components of static, random-access memory SRAM 500 are all integrated into a single device using CMOS technology.

It is contemplated that after having read the preceding disclosure, certain alterations and modifications of the present invention will no doubt become apparent to those skilled in the art. It is therefor intended that the following claims be interpreted to cover all such alterations and modifications as fall within the true spirit and scope of the invention.

What is claimed is:

1. An address-change detector (570) having an input and an output, the address-change detector (570) comprising in combination:
    a waveform generator (618) including,
    a first transistor (600) having a gate connected (542) to the address-change detector (570) input and a channel including a first end connected to receive a power-supply potential and a second end,
    a second transistor (606) having a gate connected to said first transistor (600) gate and a channel including a first end connected to said first transistor (600) channel second end and a second end,
    a third transistor (608) having a gate and a channel including a first end connected to said second transistor (606) channel second end and a second end connected to receive a circuit-ground potential,
    resistor means (610 and 612) including a first end connected to said second transistor (606) gate and a second end connected to said third transistor (608) gate, and
    a fourth transistor (616) having a gate and a channel including a first end connected to said third transistor (608) gate and a second end connected to receive the circuit-ground potential;
    first inverter means (634) having an input connected to said second transistor (606) gate and an output connected to said fourth transistor (616) gate;
    second inverter means (644) having an input connected to said first inverter means (634) input and an output; and
    gate means (658) having a pair of inputs including a first input connected to said first transistor (600) channel second end and a second input connected to said second inverter means (644) output and having an output connected (660) to the address-change detector (570) output.

2. An address-change detector (570) as recited in claim 1 wherein,
    said first inverter means (634) includes,
    a pull-up transistor (630) having a gate connected to said first inverter means (634) input and a channel including a first end connected to receive said power-supply potential and a second end connected to said first inverter means (634) output; and
    a plurality of pull-down transistors (632) each having a gate connected to said input of said first inverter means (632) and a channel including a first end connected to said output of said first inverter means (634) and a second end connected to receive the circuit-ground potential.

3. An address-change detector (570) as recited in claim 1 wherein,
    the gate means (658) includes,
    a fifth transistor (650) having a gate connected to a predetermined one of said gate means (658) inputs and a channel including a first end connected to said gate means (658) output and a second end, and
    a sixth transistor (652) having a gate connected to the other one of said gate means (658) inputs and a channel including a first end connected to said fifth transistor (650) channel second end and a second end connected to receive the circuit-ground potential.

4. An address-change detector (570) as recited in claim 3 wherein,
    said gate means (658) further includes,
    a seventh transistor (654) having a gate connected to said sixth transistor (652) gate and a channel including a first end connected to said gate means (658) output and a second end, and
    an eighth transistor (656) having a gate connected to said fifth transistor (650) gate and a channel including a first end connected to said seventh transistor (654) channel second end and a second end connected to receive the circuit-ground potential.

5. A pulse generator (700) having an input and an output, the pulse generator (700) comprising in combination:
    a first pull-up transistor (712) having a gate and a channel including a first end connected to receive a power-supply potential and a second end connected to the pulse generator (700) input;
    a switch transistor (740) having a gate and a channel including a first end connected to said pulse generator (700) first pull-up transistor (712) channel second end and a second end;
    a second pull-up transistor (744) having a gate and a channel including a first end connected to receive the power-supply potential and a second end connected to said pulse generator (700) switch transistor (740) channel second end;
    first inverter means (764) having an input connected to said pulse generator (700) switch transistor (740) channel second end and an output;
    second inverter means (770) having an input connected to said pulse generator (700) first inverter means (746) output and an output connected to said pulse generator (700) switch transistor (740) gate and to said pulse generator (700) second pull-up transistor (744) gate;
    a third pull-up transistor (772) having a gate connected to the pulse generator (700) output and a channel including a first end connected to receive the power-supply potential and a second end connected to said pulse generator (700) second inverter means (770) output;
    third inverter means (784) having an input connected to said pulse generator (700) second inverter means (770) output and an output connected to said pulse generator (700) first pull-up transistor (712) gate; and fourth inverter means (790) having an input connected to said pulse generator (700) third inverter means (784) output and an output connected to said pulse generator (700) third pull-up transistor (772) gate.

6. A pulse generator (700) as recited in claim 5 further comprising,
a fourth pull-up transistor (792) having a gate connected to said pulse generator (700) second inverter means (770) output and a channel including a first end connected to receive the power-supply potential and a second end connected to said pulse generator (700) fourth inverter means (790) output.

7. A pulse generator (700) as recited in claim 5 further comprising,
a fourth pull-up transistor (720) having a gate connected to said pulse generator (700) switch transistor (740) channel second end and a channel including a first end connected to receive the power-supply potential and a second end;
a first pull-down transistor (722) having a gate connected to said pulse generator (700) fourth pull-up transistor (720) second end and a channel including a first end connected to said pulse generator (700) first pull-up transistor (712) channel second end and a second end connected to receive a circuit-ground potential;
a second pull-down transistor (724) having a gate connected to said pulse generator (700) first pull-up transistor (712) channel second end and a channel including a first end connected to said pulse generator (700) fourth pull-up transistor (720) second end and a second end connected to receive the circuit-ground potential; and
a third pull-down transistor (724) having a gate connected to said pulse generator (700) third inverter means (784) output and a channel including a first end connected to said pulse generator (700) fourth pull-up transistor (720) second end and a second end connected to receive the circuit-ground potential.

8. An address-change-detection circuit (510) comprising in combination:
a plurality of address-change detectors (570) each having an input and an output, each of said address-change detectors (570) having,
a waveform generator (618) including,
a first transistor (600) having a gate connected to said address-change-detection circuit (510) input and a channel including a first end connected to receive a power-supply potential and a second end,
a second transistor (606) having a gate connected to said waveform generator (618) first transistor (600) gate and a channel including a first end connected to said waveform generator (618) first transistor (600) channel second end and a second end,
a third transistor (608) having a gate and a channel including a first end connected to said waveform generator (618) second transistor (606) channel second end and a second end connected to receive a circuit-ground potential,
resistor means (610 and 612) including a first end connected to said waveform generator (618) second transistor (606) gate and a second end connected to said waveform generator (618) third transistor (608) gate, and
a fourth transistor (616) having a gate and a channel including a first end connected to said waveform generator (618) third transistor (608) gate and a second end connected to receive the circuit-ground potential,
first inverter means (634) having an input connected to said waveform generator (618) second transistor (606) gate and an output connected to said waveform generator (618) fourth transistor (616) gate,
second inverter means (644) having an input connected to said waveform generator (618) first inverter means (634) input and an output, and
gate means (658) having a pair of inputs including a first input connected to said waveform generator (618) first transistor (600) channel second end and a second input connected to said waveform generator (618) second inverter means (644) output and having an output connected to said address-change-detection circuit (510) output; and
a pulse generator (700) having an input connected to said output of each of said address-change detectors (570) and an output, the pulse generator (700) including,
a first pull-up transistor (712) having a gate and a channel including a first end connected to receive the power-supply potential and a second end connected to said pulse generator (700) input,
a switch transistor (740) having a gate and a channel including a first end connected to said pulse generator (700) first pull-up transistor (712) channel second end and a second end,
a second pull-up transistor (744) having a gate and a channel including a first end connected to receive the power-supply potential and a second end connected to said pulse generator (700) switch transistor (740) channel second end,
first inverter means (764) having an input connected to said pulse generator (700) switch transistor (740) channel second end and an output,
second inverter means (770) having an input connected to said pulse generator (700) first inverter means (746) output and an output connected to said pulse generator (700) switch transistor (740) gate and to said pulse generator (700) second pull-up transistor (744) gate,
a third pull-up transistor (772) having a gate connected to said pulse generator (700) output and a channel including a first end connected to receive the power-supply potential and a second end connected to said pulse generator (700) second inverter means (770) output,
third inverter means (784) having an input connected to said pulse generator (700) second inverter means (770) output and an output connected to said pulse generator (700) first pull-up transistor (712) gate,
fourth inverter means (790) having an input connected to said pulse generator (700) third inverter means (784) output and an output connected to said pulse generator (700) third pull-up transistor (772) gate,
a fourth pull-up transistor (720) having a gate connected to said pulse generator (700) switch transistor (740) channel second end and a channel including a first end connected to receive the power-supply potential and a second end, a first pull-down transistor (722) having a gate connected to said pulse generator (700) fourth pull-up transistor (720) second end and a channel including a first end connected to said pulse generator (700) first pull-up transistor (712) channel second end and a second end connected to receive the circuit-ground potential, a second pull-down transistor (724) having a gate connected to said pulse generator (700) first pull-up transistor (712) channel second end and a channel including a first end connected to said pulse generator (700) fourth pull-up transistor (720) second end and a second end connected to receive the circuit-ground potential, and a third pull-down transistor (724) having a gate connected to said pulse generator (700) third inverter means (784) output and a channel including a first end connected to said pulse generator (700) fourth pull-up transistor (720) second end and a second end connected to receive the circuit-ground potential.

9. A static, random-access memory (500) comprising in combination:

a pair of bit lines (556 and 558);

a sense amplifier (514) connected to said bit lines (556 and 558);

a pre-charge circuit (518) having a control input and a pair of outputs each connected to a respective one of said pair of bit lines (556 and 558);

an address decoder (522);

a plurality of static, random-access-memory cells (526 and 528) each connected to each of said bit lines (556 and 558) and to said address decoder (522); and an address-change-detection circuit (510) having a plurality of inputs and having an output connected to said pre-charge circuit (518) control input, said address-change-detection circuit (510) having, a plurality of address-change detectors (570) each employing an input connected to a respective one of said address-change-detection circuit (510) inputs and employing an output, each of said address-change detectors (570) employing, a waveform generator (618) including, a first transistor (600) having a gate connected to said address-change-detection circuit (510) input and a channel including a first end connected to receive a power-supply potential and a second end, a second transistor (606) having a gate connected to said waveform generator (618) first transistor (600) gate and a channel including a first end connected to said waveform generator (618) first transistor (600) channel second end and a second end, a third transistor (608) having a gate and a channel including a first end connected to said waveform generator (618) second transistor (606) channel second end and a second end connected to receive a circuit-ground potential, resistor means (610 and 612) including a first end connected to said waveform generator (618) second transistor (606) gate and a second end connected to said waveform generator (618) third transistor (608) gate, and a fourth transistor (616) having a gate and a channel including a first end connected to said waveform generator (618) third transistor (608) gate and a second end connected to receive the circuit-ground potential, first inverter means (634) having an input connected to said waveform generator (618) second transistor (606) gate and an output connected to said waveform generator (618) fourth transistor (616) gate, second inverter means (644) having an input connected to said waveform generator (618) first inverter means (634) input and an output, and gate means (658) having a pair of inputs including a first input connected to said waveform generator (618) first transistor (600) channel second end and a second input connected to said waveform generator (618) second inverter means (644) output and having an output connected to said address-change-detection circuit (510) output and a pulse generator (700) employing an input connected to each of said address-change detectors (570) and employing an output connected to said address-change-detection circuit (510) output, said pulse generator (700) employing, a first pull-up transistor (712) having a gate and a channel including a first end connected to receive a power-supply potential and a second end, a switch transistor (740) having a gate and a channel including a first end connected to said pulse generator (700) first pull-up transistor (712) channel second end and a second end, a second pull-up transistor (744) having a gate and a channel including a first end connected to receive the power-supply potential and a second end connected to said pulse generator (700) switch transistor (740) channel second end, first inverter means (764) having an input connected to said pulse generator (700) switch transistor (740) channel second end and an output, second inverter means (770) having an input connected to said pulse generator (700) first inverter means (746) output and an output connected to said pulse generator (700) switch transistor (740) gate and to said pulse generator (700) second pull-up transistor (744) gate, a third pull-up transistor (772) having a gate and a channel including a first end connected to receive the power-supply potential and a second end connected to said pulse generator (700) second inverter means (770) output, third inverter means (784) having an input connected to said pulse generator (700) second inverter means (770) output and an output connected to said pulse generator (700) first pull-up transistor (712) gate, fourth inverter means (790) having an input connected to said pulse generator (700) third inverter means (784) output and an output connected to said pulse generator (700) third pull-up transistor (772) gate, a fourth pull-up transistor (720) having a gate connected to said pulse generator (700) switch transistor (740) channel second end and a channel including a first end connected to receive the power-supply potential and a second end, a first pull-down transistor (722) having a gate connected to said pulse generator (700) fourth pull-up transistor (720) second end and a channel including a first end connected to said pulse generator (700) first pull-up transistor (712) channel second end and a second end connected to receive a circuit-ground potential, a second pull-down transistor (724) having a gate connected to said pulse generator (700) first pull-up transistor (712) channel second end and a channel including a first end connected to said pulse generator (700) fourth pull-up transistor (720) second end and a second end connected to receive the circuit-ground potential, and a third pull-down transistor (724) having a gate connected to said pulse generator (700) third inverter means (784) output and a channel including a first end connected to said pulse generator (700) fourth pull-up transistor (720) second end and a second end connected to receive the circuit-ground potential.

* * * * *